United States Patent [19]

Chung et al.

[11] Patent Number: 4,808,840

[45] Date of Patent: Feb. 28, 1989

[54] DYNAMIC EDGE-TRIGGERED LATCH

[75] Inventors: Paul W. Chung, San Jose; Niantsu N. Wang, Milpitas, both of Calif.

[73] Assignee: International Business Machines Corporation, Armonk, N.Y.

[21] Appl. No.: 123,498

[22] Filed: Nov. 20, 1987

[51] Int. Cl.[4] .................. H03K 3/013; H03K 3/295; H03K 3/15; H03K 3/86

[52] U.S. Cl. .................. 307/290; 307/279; 307/268; 307/265; 307/601; 307/602

[58] Field of Search ............. 307/279, 290, 291, 601, 307/602, 260, 261, 354, 605, 594, 268, 265

[56] References Cited

U.S. PATENT DOCUMENTS

| | | | |
|---|---|---|---|
| 3,851,189 | 11/1974 | Moyer | 307/279 |
| 3,971,960 | 7/1976 | Means et al. | 307/279 X |
| 4,575,644 | 3/1986 | Leslie | 307/291 |
| 4,583,008 | 4/1986 | Grugett | 307/602 X |
| 4,607,173 | 8/1986 | Knoedl Jr. | 307/291 |
| 4,613,777 | 9/1986 | Kible | 307/602 X |
| 4,620,119 | 10/1986 | Williams | 307/602 X |
| 4,675,546 | 6/1987 | Shaw | 307/265 |
| 4,710,653 | 12/1987 | Yee | 307/602 X |

Primary Examiner—Stanley D. Miller
Assistant Examiner—David R. Bertelson
Attorney, Agent, or Firm—Simon K. Lee; Henry E. Otto, Jr.

[57] ABSTRACT

An edge-triggered latch is disclosed which has a low setup time and almost no metastability problem. It comprises a dynamic sensing means for detecting the voltage level of the data signal and at least one dynamic buffer for amplifying said detected voltage level into one of two logic levels recognizable by a static latch wherein the sampled result is stored.

14 Claims, 1 Drawing Sheet

DYNAMIC EDGE-TRIGGERED LATCH

TECHNICAL FIELD

This invention relates to edge-triggered latches. More particularly, this invention relates to apparatus and method for decreasing the setup time of an edge-triggered latch, as well as the probability of its having a metastability problem.

BACKGROUND OF THE INVENTION

Edge-triggered latches have commonly been used in electronic systems for sampling externally generated signals. In most applications, such signals would arrive asynchronously with respect to the system clock which controls a system's internal operations. A signal input is usually sampled with the edge of the system clock which triggers a latch to register the state of the signal. Ideally, the input signal should be sampled only when it is in either one of two bistable states, each representing a binary value. Unfortunately, there often exists a high probability that, at any sampling instant, the signal level is at the metastable state of the latch, i.e. at a level where the state is indeterminable.

To lower the probabilty of metastability, conventional edge-triggered latches are required to have a setup time, which is the minimum duration in which the input signal has been settled in one of the bistable states before the occurrence of the sampling pulse. When high speed signal processing is required, however, an edge-triggered latch having low setup time and decreased metastability problem is desired.

U.S. Pat. No. 4,227,699 discloses a latch circuit operable as a D-type edge trigger which is basically formed by combining two polarity latches with other logic circuits. Although the latch can conform to LSSD design rules, it nevertheless suffers from long setup time and metastability problem.

It is an object of this invention to provide apparatus and method for reducing the setup time of an edge-triggered latch.

It is also an object of this invention to provide apparatus and method for eliminating a metastability problem in an edge-triggered latch.

SUMMARY OF THE INVENTION

In one aspect, the present invention is an apparatus for producing an edge-triggered signal based upon detecting the logic state of a data signal input. The apparatus comprised a dynamic sensing means receiving the data signal and a trigger signal for detecting the voltage level of the data signal; and at least one dynamic buffer coupled to said sensing means for amplifying said detected voltage level into one of two logic levels recognizable by a static latch.

In another aspect, this invention is a method for detecting the logic state of a data signal input being sampled by an edge-triggered latch. The method comprises the steps of: detecting the voltage level of the data signal using a dynamic sensing means; and amplifying the detected voltage level using at least one dynamic buffer into one of two logic levels recognizable by said static latch.

DESCRIPTION OF THE PREFERRED EMBODIMENT

Figure 1:
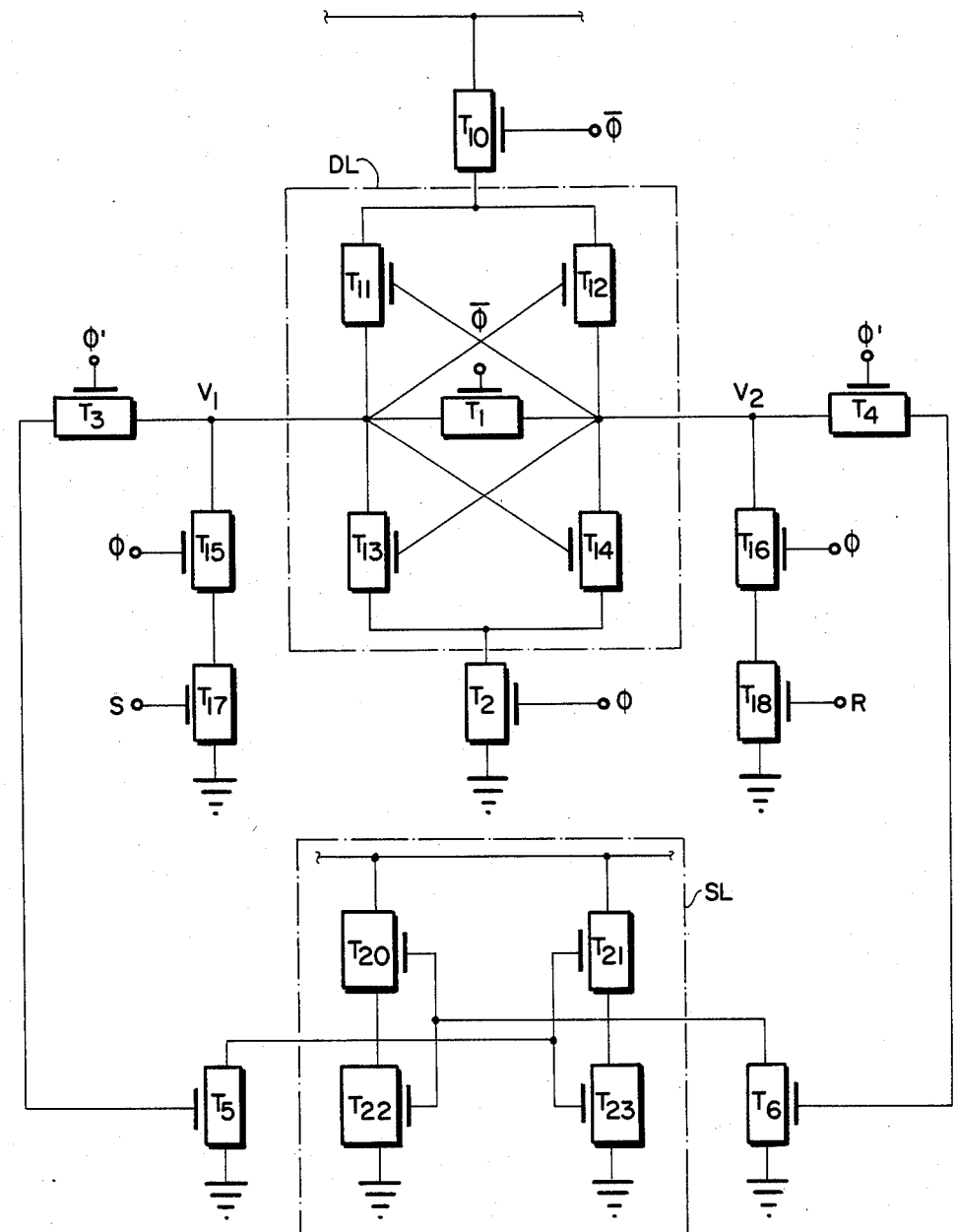
FIG. 1 is a schematic circuit diagram of one implementation of the present invention.

Referring to FIG. 1, there is shown a schematic diagram of a preferred implementation of the present invention. A first dynamic buffer, comprises a first pair of cross-coupled p-channel Field Effect Transistors (FETs), $T_{11}$ and $T_{12}$, is connected between nodes $V_1$ and $V_2$. A dynamic buffer is characterized by its not being able to enter into a metastable state. A second dynamic buffer, comprises a second pair of cross-coupled n-channel FETs, $T_{13}$ and $T_{14}$, is also connected between nodes $V_1$ and $V_2$ in parallel with the first dynamic buffer. The two dynamic buffers amplify voltage signals across these two nodes into full logic level.

Both $T_{11}$ and $T_{12}$ are enabled by the negative phase of sampling clock $\bar{\phi}$ (i.e. $-\phi$) which controls the gate of p-channel FET $T_{10}$. Both $T_{13}$ and $T_{14}$ are enabled by the positive phase of the sampling clock $\phi$ which controls the gate of n-channel FET $T_2$.

A dynamic sensing device is connected to node $V_1$ for receiving a differential input of the signal to be sampled. This dynamic device comprises two n-channel FETs, $T_{16}$ and $T_{18}$, connected in series. Similarly, at node $V_2$ is conneced another dynamic sensing device for receiving the opposite differential input of the signal to be sampled, This dynamic device comprises two serially connected n-channel FETs, $T_{15}$ and $T_{17}$.

Between nodes $V_1$ and $V_2$ is a precharging FET, $T_1$, which provides a path between these nodes. When $T_1$ conducts, nodes $V_1$ and $V_2$ connect and their voltage levels are equalized, thereby allowing them to switch faster. The gate of $T_1$ is controlled by the negative phase of the sampling clock $\phi$ (i.e. $-\bar{\phi}$).

Figure 2:
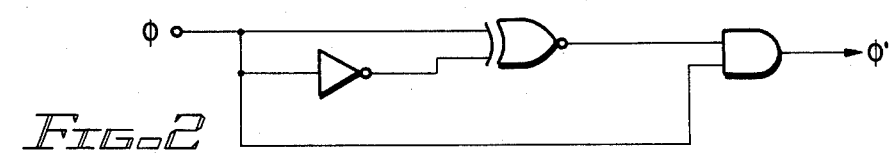
FIG. 2 is a schematic diagram of a circuit which generates a one-shot pulse from the rising edge of a clock signal.

Each of the differential outputs of the dynamic buffer DL is transferred to respective input devices, $T_5$ and $T_6$, of static latch SL. SL consists of n-channel FETs $T_{20}$, $T_{21}$, $T_{22}$, and $T_{23}$. The differential output at node $V_1$ is transferred to $T_5$ via a n-channel FET $T_3$. The differential output at node $V_2$ is transferred to $T_6$ via a p-channel FET $T_4$. The gates of both $T_4$ and $T_3$ are controlled by a clock $\phi'$ which is a time delayed pulse of $\phi$. One method of generating $\phi'$ is by delaying the rising edge (the triggering edge) of clock $\phi$. A circuit for accomplishing such purpose is illustrated in FIG. 2.

Let $T=0$ be the sampling time. Before $T=0$, clock 100 would be "low" and its inverted clock $-\bar{\phi}$ would be "high". Devices $T_{10}$ and $T_2$ are thereby cut off while device $T_1$ opens. The opening of device $T_1$ equalizes node voltages $V_1$ and $V_2$ at $T<0$. Moreover, since devices $T_3$ and $T_4$ are cut off, static latch SL is not affected.

At the sampling instant, $T=0$, $\phi$ goes up. Precharging device $T_1$ is disabled. The differential inputs of the signal being sampled, received at $T_{17}$ and $T_{18}$, are gated by devices $T_{15}$ and $T_{16}$ to nodes $V_1$ and $V_2$. Devices $T_{10}$ and $T_2$ set the latch quickly. The output at nodes $V_1$ and $V_2$ are then sent to input devices, $T_5$ and $T_6$ respectively, of the static latch SL. The pass gates $T_3$ and $T_4$ a re controlled by $\phi'$ which goes up with $\phi$ at a delay so that the dynamic latch can be set without too much load. Also, $\phi'$ is generated as a one shot clock following the rising edge of $\phi$ so that the outputs of the static latch SL stays constant until the next trigger time.

Although the circuit is implemented with particular semiconductor device type, it will be understood by those skilled in the art that other devices having the same characteristics can be used. For example, p-channel FETs can be replaced by n-channel FETs in the circuits if corresponding changes on other parts of the circuits are made. Thus, while the invention has been described in the context of a preferred embodiment, it will be apparent to those skilled in the art that the present invention may be modified in numerous ways and may assume many embodiments other than that specifically set forth and described above, without departing from the spirit, scope and teaching of the invention.

We claim:

1. An apparatus for producing an edge-triggered signal for use in an edge-triggered latch, comprising:
    dynamic sensing means responsive to a trigger signal and a data signal for detecting the voltage level of said data signal;
    means for producing a pulse delayed with respect to the trigger signal;
    dynamic buffer means coupled to said sensing means for amplifying said detected voltage level; and
    means responsive to said pulse for gating the amplified detected voltage signal into one of two logic levels recognizable by the latch.

2. The apparatus as in claim 1, wherein said buffer comprises means for precharging said sensing means to reduce the setup time of the sensing means.

3. The apparatus as in claim 1, wherein said dynamic buffer means comprises at least one pair of cross-coupled FET devices.

4. The apparatus as in claim 1, wherein said sensing means comprises at least two FETS connected in series.

5. The apparatus as in claim 1, wherein there are two nodes, each node connected to said dynamic buffer means, and to a respective sensing means, said dynamic buffer means comprising means operative in one state to precharge and equalize the voltage level at said nodes for reducing switching time when said dynamic buffer means is operative in its other state to amplify said detected voltage level as detected by one of said sensing means.

6. An edge-triggered latch, comprising:
    a static latch;
    a dynamic sensing means responsive to a trigger signal and a data signal for detecting the voltage level of said data signal;
    dynamic buffer means coupled to said sensing means for amplifying said detected voltage level into one of two logic levels recognizable by said static latch; and
    gating means coupled to said static latch and said dynamic buffer means for gating the output of said dynamic buffer means to said static latch between predetermined time windows.

7. An edge-triggered latch as in claim 6, further comprising mean for precharging and equalizing said sensing means to reduce the setup time between the trigger signal and data signal.

8. An edge-triggered latch as in claim 6 wherein said dynamic buffer means comprises a pair of cross-coupled p-channel FET devices and a pair of cross-coupled n-channel FET devices.

9. An edge-triggered latch as in claim 6, wherein said sensing means comprises at least two FETs of the same channel type connected in series.

10. A method of producing an edge-triggered signal from a data signal and a trigger signal, said edge-triggered signal to be stored by an edge-triggered latch, comprising the steps of:
    detecting the voltage level of said data signal using a dynamic sensing device; and
    using a dynamic buffer means, amplifying said detected voltage level; and
    gating the amplified detected voltage level into one of two logic levels recognizable by said static latch.

11. The method as in claim 10, comprising the further steps of precharging and equalizing the voltage level at two nodes connected to the dynamic sensing device to reduce the setup time between the trigger signal and data signal.

12. The method as in claim 10, wherein said dynamic buffer means comprises at least one pair of cross-coupled FET devices.

13. The method as in claim 10, wherein said sensing device comprises at least two FETs of the same channel type connected in series.

14. The method as in claim 11, wherein during the amplifying step, the voltage level at one node is detected and amplified relative to that of the other node, and
    during said gating step, the voltages at both nodes are gated to the static latch as differential inputs.

* * * * *